United States Patent
Wu

(10) Patent No.: US 6,914,484 B2
(45) Date of Patent: Jul. 5, 2005

(54) WIDEBAND CONSTANT-GAIN VOLTAGE AMPLIFIER

(75) Inventor: Yue Wu, San Diego, CA (US)

(73) Assignee: Qualcomm, Incorporated, San Diego, CA (US)

( * ) Notice: Subject to any disclaimer, the term of this patent is extended or adjusted under 35 U.S.C. 154(b) by 66 days.

(21) Appl. No.: 10/434,675

(22) Filed: May 9, 2003

(65) Prior Publication Data

US 2004/0222852 A1 Nov. 11, 2004

(51) Int. Cl.[7] ............................................. H03F 3/45
(52) U.S. Cl. ................................... 330/252; 330/254
(58) Field of Search .............................. 330/252, 254, 330/256, 259, 261, 69

(56) References Cited

U.S. PATENT DOCUMENTS

| | | | | |
|---|---|---|---|---|
| 5,973,562 A | * | 10/1999 | Weber | 330/252 |
| 5,990,740 A | * | 11/1999 | Groe | 330/252 |
| 6,154,094 A | * | 11/2000 | Seven | 330/252 |
| 6,236,268 B1 | * | 5/2001 | Ridgers | 330/252 |

FOREIGN PATENT DOCUMENTS

| | | |
|---|---|---|
| EP | 0270156 | 6/1988 |
| EP | 0510530 | 10/1992 |
| EP | 0544627 | 6/1993 |

* cited by examiner

*Primary Examiner*—Henry Choe
(74) *Attorney, Agent, or Firm*—Phillip R. Wadsworth; Charles D. Brown; Nicholas J. Pauley

(57) ABSTRACT

A wideband, constant-gain voltage amplifier. An input transistor has a transconductance that is a function of temperature and fabrication process. A transimpedance amplifier is connected to the input transistor. The transimpedance amplifier has a transimpedance that is a function of temperature and process that is substantially the inverse of the function of temperature and fabrication process of the transconductance of the input transistor.

20 Claims, 3 Drawing Sheets

WIDEBAND CONSTANT-GAIN VOLTAGE AMPLIFIER

FIELD

This application relates to amplifiers and, more specifically, to amplifiers having a wide bandwidth and constant gain.

BACKGROUND

Amplifiers are electronic devices that typically increase the level of an electronic signal. Amplifiers have many characteristics that are often of concern to circuit designers. One such characteristic is the gain of the amplifier. The gain represents a quantification of the amount of amplification that is provided by the amplifier.

In many applications, it is important that the gain of the amplifier remain constant, notwithstanding variation in the temperature in which the amplifier operates, variation in the processes that are used to fabricate the components of the amplifier, and/or variation in the frequency of the signal that is delivered to the amplifier for amplification.

Variation in the temperature in which an amplifier operates often causes variation in the gain of the amplifier. This is because the temperature change often affects one or more operational parameters of one or more of the electrical components that are used in the amplifier. Changes in these operational parameters often cause corresponding changes in the gain.

Similarly, the operational parameters of one or more components in an amplifier are often affected by variation in the processes that are used to fabricate these components. Indeed, the operational parameters of an electronic component are often specified by their manufacturer to fall within a range, rather than having only a single value. The specification of such ranges explicitly reflects anticipated variation in fabrication process.

The frequency of the signal that the amplifier is given to amplify can also cause variation in the operational characteristics of one or more components in the amplifier. For example, the operational characteristics of transistors—devices commonly used in amplifiers—are often affected markedly by the frequency of the signal that is processed by the transistors. One typical cause of this variation is internal capacitance in the transistor, a characteristic that reacts differently to different frequencies.

There has been a need for amplifiers that have gains that remain substantially constant, notwithstanding significant changes in operating temperature, fabricating process or input frequency. Such a need is particularly present in the cellular communication art. In this art, operation at very high frequency is common and several amplifiers are often cascaded, effectively multiplying many of the problematic effects of gain instability.

SUMMARY

One aspect is an amplifier comprising an input transistor that has a transconductance that is a function of temperature and fabrication process. A transimpedance amplifier may be connected to the input transistor and may have a transimpedance that is substantially the inverse of the function of temperature and fabrication process of the transconductance of the input transistor.

Another aspect is an amplifier including an input means for receiving an input signal that has a transconductance that is a function of temperature and fabrication process. Transimpedance means may be connected to the input means for providing a transimpedance that is substantially the inverse of the function of temperature and fabrication process of the transconductance of the input means.

Another aspect is an amplifier including an input circuit that has a transconductance that is a function of temperature and fabrication process. A compensated load circuit may be connected as a load to the input circuit that compensates for variation in the transconductance of the input circuit, thereby maintaining the gain of the amplifier, notwithstanding variation in the transconductance of the input circuit.

Another aspect is an amplifier including an input means for receiving an input signal that has a transconductance that is a function of temperature and fabrication process. Compensation means may be connected as a load to the input means for compensating for variation in the transconductance of the input means, thereby maintaining the gain of the amplifier, notwithstanding variation in the transconductance of the input circuit.

Another aspect is an amplifier including an input transistor that is configured in a circuit to have an output. A transimpedance amplifier may be connected as a load on the output of the input transistor.

Another aspect is a circuit including a transistor having a base that has a voltage divider network connected to the base of the transistor. The voltage divider network may include a first and second resistance and a diode connected to the first resistance in a manner that causes the diode to be reverse biased during operation.

It is to be understood that other embodiments will become readily apparent to those skilled in the art from the following detailed description, wherein only embodiments are shown and described by way of illustration. As will be realized, there are many other and different embodiments, and the details that are discussed are capable of modification in various other respects, all without departing from the spirit and scope of what is claimed in this patent application. Accordingly, the drawings and detailed description are to be regarded as illustrative in nature, not as restrictive.

BRIEF DESCRIPTION OF DRAWINGS

Aspects are illustrated in the accompanying drawings by way of example only, and not by way of limitation.

DETAILED DESCRIPTION

The detailed description set forth below in connection with the appended drawings is intended as a description of exemplary embodiments, and is not intended to represent the only embodiments that can be practiced. The term "exemplary" used in this description means "serving as an example, instance, or illustration," and should not necessarily be construed as preferred or advantageous over other embodiments. The detailed description includes specific details for the purpose of providing a thorough understanding. However, it will be apparent to those skilled in the art that these specific details are not all essential. In some instances, well-known structures and devices are shown in block diagram form to better illustrate certain concepts.

Figure 1:
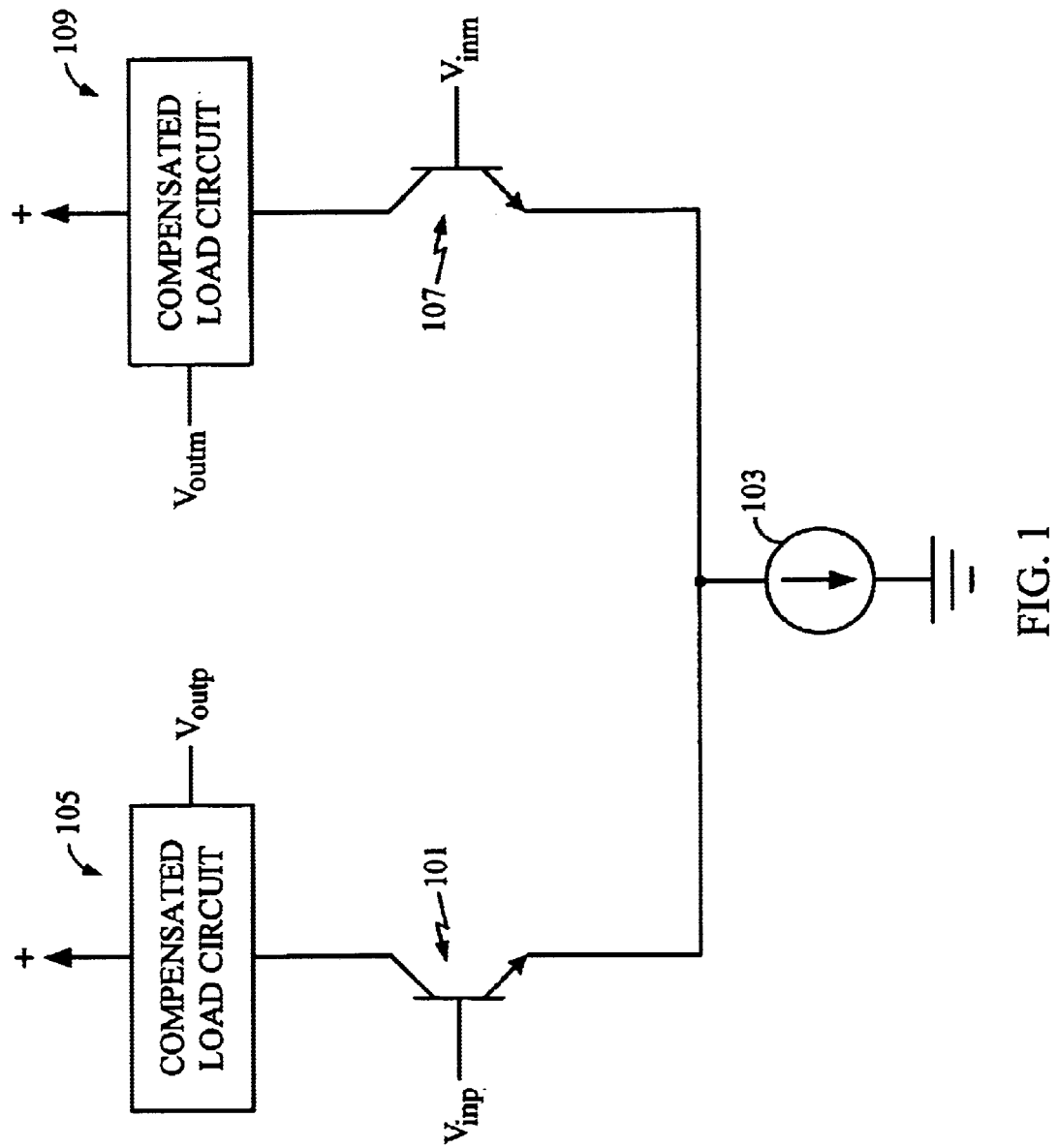
FIG. 1 is a diagram of one embodiment of a wide band, constant gain voltage amplifier.

FIG. 1 is a diagram of one embodiment of a wideband, constant-gain voltage amplifier. As shown in FIG. 1, an input transistor 101 may receive an input signal, $V_{inp}$, at its base. Its emitter may be connected to a constant current source 103. Its collector may be connected to a compensated load circuit 105 that may generate an output signal $V_{outp}$.

As with most transistors, variation in the input voltage, in this case $V_{inp}$, may cause corresponding variation in the current that is drawn through the collector of the transistor 101. The ratio of the varying output current to the varying input voltage at the particular level of bias set by the constant circuit source 103 is often referred to as the transconductance of the transistor. Mathematically, the transconductance of a transistor, g, may be expressed as:

$$g = \frac{\partial I_{out}}{\partial E_{in}}, \quad (1)$$

wherein $\partial I_{out}$ represents the change in output current that is caused by $\partial E_{in}$, the change in input voltage.

The current flowing through the collector of the transistor 101 may also flow through the compensated load circuit 105. The compensated load circuit 105 may act like a resistance, thereby generating an output voltage $V_{outp}$, as a function of the current that is drawn by the transistor 101. A combination of the transistor 101, the constant current source 103 and the compensated load circuit 105 may form an amplifier. The input to the amplifier may be $V_{inp}$, while the output of the amplifier may be $V_{outp}$.

The gain of this amplifier may be $$\frac{V_{outp}}{V_{inp}}.$$

$V_{outp}$ may be a function of the current drawn by the transistor 101. This current, in turn, may be a function of the transconductance g101 of the transistor 101, as reflected by equation (1) above. Thus, the gain of the amplifier formed by the components 101, 103 and 105 may be a function of the transconductance of the transistor 101, $g_{101}$.

The transconductance of the transistor 101, like the transconductance of most transistors, may be a function of the temperature in which the transistor operates, as well as the fabrication process that is used to create the transistor. Variation in this operating temperature or the fabrication process can cause a corresponding variation in the gain of the amplifier. This is often undesirable.

One of the functions of the compensated load circuit 105 may be to compensate for these variations in the transconductance of the transistor 101. To accomplish this, the compensated load circuit 105 may be configured to vary the load that it presents to the transistor 101 in substantially inverse proportion to the variation in the transconductance of the transistor 101 as a function of temperature and fabrication process. Coupling the variation in the transconductance of the transistor 101 with a substantially-corresponding inverse variation in the load presented by the compensated load circuit 105 may cause the variation in the transconductance of the transistor 101 not to affect the gain of the amplifier. The net result is that the gain of the amplifier may remain substantially constant, notwithstanding significant changes in the temperature in which the transistor 101 operates or its fabrication process.

Another input transistor 107 and compensated load circuit 109 may amplify another input signal in cooperation with the constant current source 103, such as a complementary input signal, $V_{inm}$. The compensated load circuit 109 may be configured to accomplish the same result with respect to the input transistor 107, as the compensated load circuit 105 was configured to accomplish in connection with the input transistor 101, as more particularly discussed above. The use of both of these amplifiers in a single circuit creates a differential amplifier that can effectively amplify a signal having both a positive and complementary negative component with a constant gain, notwithstanding variation in temperature or fabrication process.

Such a complementary set of amplifiers is often referred to as a differential amplifier. Although such a complementary set is shown in FIG. 1, it is, of course, to be understood that a circuit with only a single amplifier could be used, as well as circuits with more than two amplifiers. If several amplifiers are used, they could be cascaded, configured in parallel, or configured in a combination of these ways, as well as in other configurations. In each case, the amplifier may be configured as described above to cause its gain to remain substantially constant, notwithstanding variation in operating temperature or fabrication process.

Figure 2:
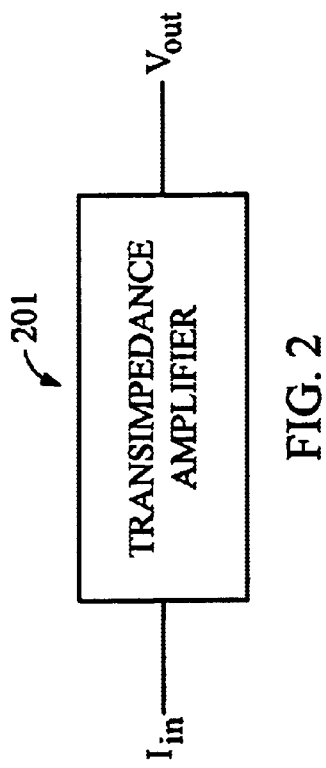
FIG. 2 is a diagram of one embodiment of one of the compensated load circuits shown in FIG. 1.

FIG. 2 is a diagram of one embodiment of one of the compensated load circuits shown in FIG. 1. As shown in FIG. 2, the compensated load circuit 105 in FIG. 1 may include a transimpedance amplifier 201. A transimpedance amplifier is a circuit that may provide an output voltage $V_{out}$ as a function of an input current $I_{in}$. The amplifier is often referred to as a transimpedance amplifier because the gain of the amplifier, $$\frac{V_{out}}{I_{in}},$$

is a function of the resistance of the amplifier or, in more general terms, its impedance.

When used for the compensated load circuit 105 in FIG. 1, the transimpedance amplifier 201 in FIG. 2 may present a load resistance in the pathway of the collector current in the transistor 101 in FIG. 2. The current flowing through this resistance may generate an output voltage in accordance with Ohm's law, which is represented by $V_{outp}$ in FIG. 1 and $V_{out}$ in FIG. 2.

The transimpedance amplifier 201 may be configured to provide the necessary compensation for the compensated load circuit 105 in FIG. 1. Specifically, the transimpedance amplifier 201 may be configured such that its transimpedance is a function of temperature and fabrication process that is substantially the inverse of the function of temperature and fabrication process of the transconductance of the input transistor 101. Thus, as the transconductance of the transistor 101 in FIG. 1 changes due to changes in temperature or fabrication process, the transimpedance of the transimpedance amplifier 201 in FIG. 2 may change by a similar amount, but inversely. The combined effect of the change in the transconductance of the transistor 101 with the inverse change in the transimpedance of the transimpedance amplifier 201 may cause the gain of the amplifier to remain substantially the same, notwithstanding the changes in temperature and fabrication process.

Figure 3:
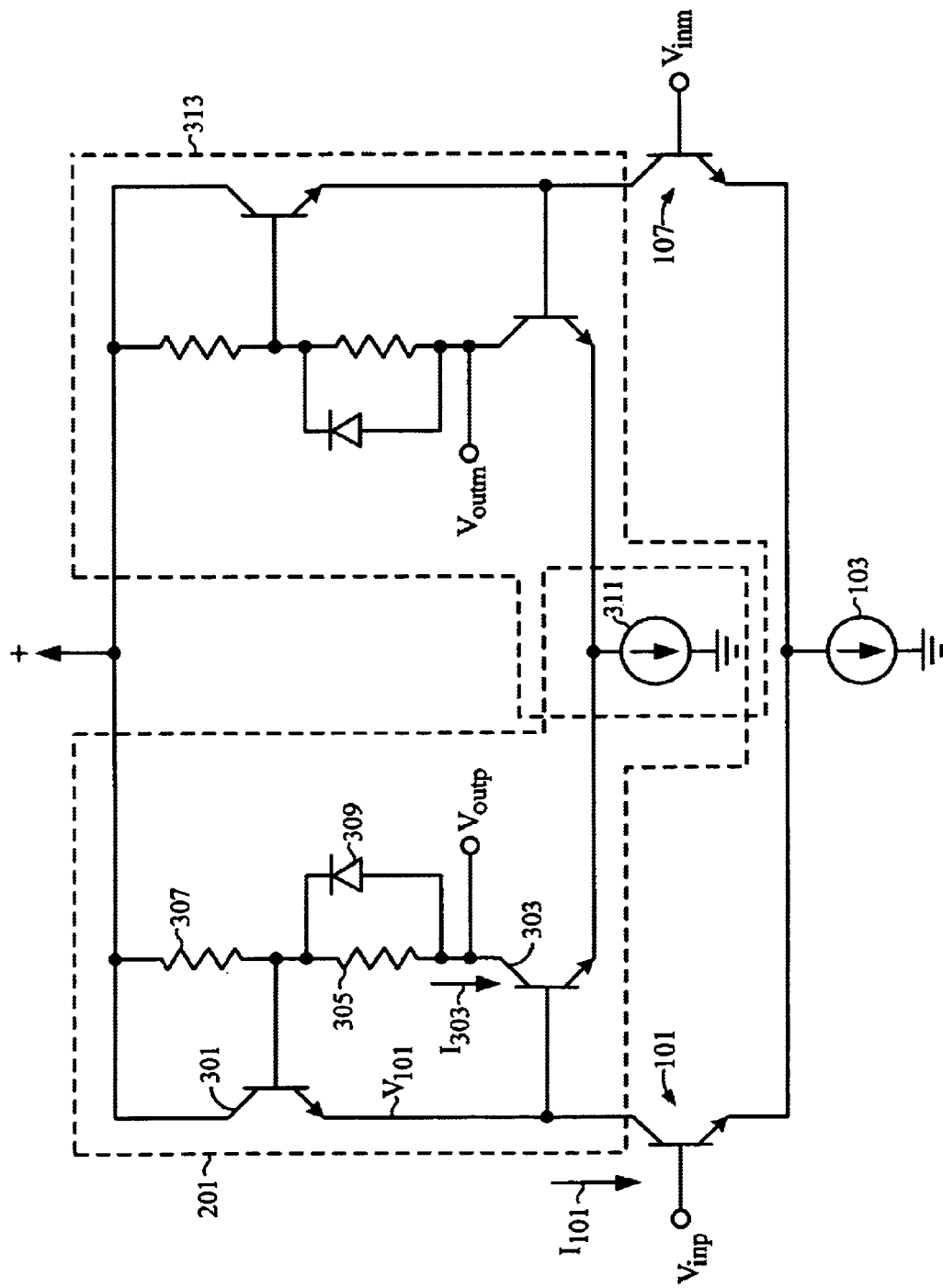
FIG. 3 is a diagram of the embodiment of a wide band, constant gain voltage amplifier shown in FIG. 1, using an embodiment of the transimpedance amplifier shown in FIG. 2.

FIG. 3 is a diagram of the embodiment of a wideband, constant-gain voltage amplifier shown in FIG. 1, using an embodiment of the transimpedance amplifier shown in FIG. 2. As shown in FIG. 3, the input transistors 101 and 107 and the constant current source 103 may be present. The transimpedance amplifier 201 may include a compensation transistor 301, an output transistor 303, and a voltage divider network connected to the base of the compensation transistor 301 that may include a first resistance 305 and a second resistance 307.

It will now be shown mathematically that the transimpedance amplifier 201 in FIG. 3 can provide the needed, inversely varying transimpedance.

As a first step, it is assumed that the base of the compensation transistor 301 is disconnected from the voltage divider network. With this assumption, the open-loop, forward-gain A of the transimpedance amplifier can be expressed as:

$$A = \frac{V_{outp}}{I_{101}}, \qquad (2)$$

where $V_{outp}$ and $I_{101}$ are as shown in FIG. 3. Based on equation (1), $I_{101}$ in equation (2) may be the equivalent of $V_{101} \times g_{301}$. Based on Ohm's law, $V_{outp}$ in FIG. 3 may be equivalent to $I_{303}$ in FIG. 3, times the sum of the resistances 305 and 307. Substituting these equivalencies, the open-loop, forward-gain of the transimpedance amplifier 201 may be expressed as:

$$a = \frac{V_{outp}}{I_{101}} = \frac{1}{g_{301}} * g_{303}(R_{305} + R_{307}) \qquad (3)$$

The open loop gain LG of the transimpedance amplifier 201 can be expressed as:

$$LG = a * \frac{R_{307}}{R_{307} + R_{305}} * g_{301} = g_{303} * R_{307} \qquad (4)$$

Thus, the closed loop gain TR may be expressed as follows:

$$TR = \frac{a}{1 + LG} = \frac{g_{303}(R_{307} + R_{305})}{g_{301}(1 + g_{303} * R_{307})} \qquad (5)$$

The overall gain of the amplifier A may thus be expressed as:

$$A = \frac{g_{101} g_{303}(R_{307} + R_{305})}{g_{301}(1 + g_{303} R_{307})} \qquad (6)$$

Equation (6) can be simplified if the product of the transconductance of transistor 303, $g_{303}$, times the resistance 307, $R_{307}$, is made much greater than 1 (e.g., greater than 10); that is:

$$g_{303} R_{307} \gg 1 \text{ or } g_{303} R_{307} > 10 \qquad (7)$$

With this restriction, equation (6) can be simplified as:

$$A \approx \frac{g_{101}}{g_{301}} \frac{(R_{307} + R_{305})}{R_{307}} \qquad (8)$$

As can be seen above from equation (8), the gain A of the amplifier is much less subject to variation due to variation in the transconductance $g_{101}$ of the input transistor 101. This is because the transconductance $g_{101}$ is divided by the transconductance $g_{301}$ of the compensation transistor 301. Similarly, the gain of the amplifier is much less sensitive to variation in the values of the resistances 305 and 307 due to process and temperature variations. This is because variation in the sum of resistances $R_{305}$ and $R_{307}$ are somewhat counterbalanced by variation in the resistance $R_{307}$.

The variation in the gain A can often be further minimized by substantially matching the physical characteristics of the input transistor 101 with the compensation transistor 301, thus making their transconductance values, $g_{101}$ and $g_{301}$, approximately the same. This could completely remove the value of the transconductances from equation (8) above, thus making the gain of the amplifier independent of variation in the transconductance of the input transistor 101.

During operation, the input transistor 101 also exhibits internal capacitance, such as internal capacitance between its base and collector. As is well known, the effect of this capacitance is amplified because of the negative feedback from the collector back to the base. The amplified effect of this capacitance is often referred to as the "Miller effect."

With the circuit shown in FIG. 3, however, the input impedance $Z_{in}$ of the transimpedance amplifier 201 is very small. Specifically:

$$Z_{in} = \frac{1/g_{301}}{1 + LG} \approx \frac{1}{g_{303} g_{301} R_{307}} \qquad (9)$$

In turn, this causes the gain of the input transistor 101 to be relatively low, minimizing the Miller effect. As a result, the input transistor 101 does not impose a great deal of capacitive loading, thus enhancing the bandwidth of the amplifier. Bandwidths of at least 3 GHz with this configuration may be possible.

At very high frequencies, however, the loop gain begins to drop and the transimpedance gain will peak. This results from the Miller effect in the compensation transistor 301 and the corresponding, relatively high impedance of the circuit in which the compensation transistor 301 operates.

A diode 309 may be provided as part of the transimpedance amplifier 201 to help compensate for this. As shown in FIG. 3, it may be configured in the circuit such that it is reverse-biased during operation. When operated in this mode, the diode appears to the circuit as a capacitance.

Figure 4:
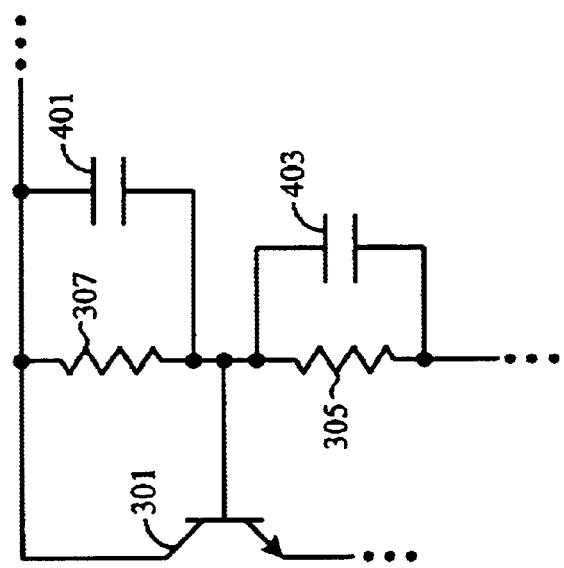
FIG. 4 is a diagram illustrating the internal capacitance exhibited by a transistor and by a diode in FIG. 3.

FIG. 4 is a diagram illustrating the internal capacitance exhibited by a transistor and by a diode in FIG. 3. Specifically, the internal capacitance between the base and collector of the compensation transistor 301 is illustrated in FIG. 4 by a capacitor 401, and the internal capacitance of the reverse-biased diode 309 is illustrated in FIG. 4 by a capacitance 403.

Referring again to equation (8), the gain of the amplifier in FIG. 3 may be essentially set by the ratio of the resistors 305 and 307. As the frequency of the input signal changes, however, the reactance caused by the internal capacitances 401 and 403 will similarly change. To insure that these changes in reactance do not alter the ratio set by the values of the resistors 305 and 307, the following relationship may be satisfied:

$$\frac{C_{401}}{C_{403}} = \frac{R_{307}}{R_{305}} \qquad (10)$$

Thus, selecting the diode 309 such that its internal capacitance satisfies equation (10) when reverse-biased may minimize the effect of the frequency of the input signal on the gain of the transimpedance amplifier, thus enhancing the bandwidth of the transimpedance amplifier. The diode 309 may include the base collector junction of a transistor.

Of course, the diode 309 is an optional component. The amplifier shown in FIG. 3 will work without it, but may exhibit greater sensitivity to variations in temperature and process at higher frequencies.

When the output of the output transistor 303 is connected to another circuit, this may load the collector of the output transistor 303 and may add capacitance to it. This could affect the stability of the gain of the circuit. To help compensate for this, the size of the input transistor 101 may be made somewhat larger than the size of the compensation transistor 301.

A size differential of less than 10% may be used. The size differential may also be optimized empirically or by calculation to minimize changes in the gain of the amplifier as a function of frequency.

Transimpedance amplifier 313 may be composed of the same components and governed by the same considerations as were discussed above in connection with the transimpedance amplifier 201 or may be composed of different components or governed by different considerations. The transimpedance amplifier 313 may also be omitted from the circuit of FIG. 3. When present, it forms a differential amplifier in conjunction with the transimpedance amplifier 201.

All of the transistors have thus-far been illustrated in the drawings as bipolar junction transistors. However, Field Effect Transistors (FETs) and other types of transistors can also be used with appropriate circuitry changes.

Similarly, FIG. 3 merely illustrates one approach for using a reverse-biased diode to compensate for the Miller effect of a transistor. Other configurations may also be used. Further, the use of a reverse-biased diode to compensate for the Miller effect of a transistor is not limited to transimpedance amplifier circuits or even amplifier circuits.

The amplifier may be operated over a broad range of frequencies, including in the GHz, MHz and KHz ranges. The amplifier may be used at the initial, intermediate or final stages of the overall amplification process.

The description that has now been provided of various embodiments should enable a person of ordinary skill in the art to make and use the technology that is set forth in the claims below. Various modifications to these embodiments will be readily apparent to those skilled in the art, and the general principles defined in this discussion may also be applied to other embodiments, without departing from the spirit or scope of the technology that is set forth in the claims below.

What is claimed is:

1. An amplifier comprising:
   a) an input transistor having a transconductance that is a function of temperature and fabrication process; and
   b) a transimpedance amplifier coupled to the input transistor having a transimpedance that is a function of temperature and fabrication process that is substantially the inverse of the function of temperature and fabrication process of the transconductance of the input transistor.

2. The amplifier of claim 1 wherein the amplifier is configured to maintain the gain of the amplifier substantially constant, notwithstanding variation in the transconductance of the input transistor cause by temperature or fabrication process.

3. The amplifier of claim 2 wherein the amplifier is configured to have a bandwidth of at least 3 GHz.

4. The amplifier of claim 1 wherein the transimpedance amplifier includes a compensation transistor having a transconductance that is substantially the same function of temperature and fabrication process as the transconductance of the input transistor.

5. The amplifier of claim 4 wherein the physical characteristics of the input transistor and the compensation transistor are substantially matched.

6. The amplifier of claim 4 wherein the size of the input transistor is larger than the size of the compensation transistor.

7. The amplifier of claim 6 wherein the size of the input transistor is not more than 10% larger than the size of the compensation transistor.

8. The amplifier of claim 6 wherein the ratio of the size of the input transistor to the size of the compensation transistor is substantially optimized to minimize changes in the gain of the amplifier as a function of frequency.

9. The amplifier of claim 4 wherein the transimpedance amplifier further includes an output transistor having a transconductance and a resistance coupled to the compensation transistor, the product of the resistance and the transconductance of the output transistor being at least ten.

10. The amplifier of claim 4 further including a diode coupled to the compensation transistor in a manner that causes the diode to be reversed biased during operation.

11. The amplifier of claim 10 wherein the diode includes the base-collector junction of a transistor.

12. The amplifier of claim 10 wherein:
   a) the compensation transistor has a base and a collector and internal capacitance between the base and collector;
   b) the transimpedance amplifier includes a first resistance and a second resistance coupled to the compensation transistor;
   c) the diode has internal capacitance; and
   d) the ratio of the internal capacitance in the compensation transistor to the internal capacitance in the diode is substantially the same as the ratio of the first resistance to the second resistance.

13. The amplifier of claim 4 wherein the input transistor and the compensation transistor comprise bipolar junction transistors.

14. An amplifier comprising:
   a) input means for receiving an input signal, the input means having a transconductance that is a function of temperature and fabrication process; and
   b) transimpedance means, coupled to the input means, for providing a transimpedance that is a function of temperature and fabrication process that is substantially the inverse of the function of temperature and fabrication process of the transconductance of the input means.

15. The amplifier of claim 14 wherein the transimpedance means includes compensation means for providing a transconductance that is substantially the same function of temperature and fabrication process as the transconductance of the input transistor.

16. An amplifier comprising:
   a) an input circuit having a transconductance that is a function of temperature and fabrication process; and
   b) a compensated load circuit, coupled as a load to the input circuit, that compensates for variation in the transconductance of the input circuit, thereby maintaining the gain of the amplifier, notwithstanding variation in the transconductance of the input circuit.

17. The amplifier of claim 16 wherein:
a) the input circuit includes a transistor; and
b) the compensated load circuit includes a transimpedance amplifier.

18. An amplifier comprising:
a) input means for receiving an input signal, the input means having a transconductance that is a function of temperature and fabrication process; and
b) compensation means, coupled as a load to the input means, for compensating for variation in the transconductance of the input means, thereby maintaining the gain of the amplifier, notwithstanding variation in the transconductance of the input circuit.

19. A circuit comprising:
a) a transistor having a base;
b) a voltage divider network connected to the base of the transistor, the voltage divider network including a first and second resistance; and
c) a diode connected in parallel to the first resistance in a manner that causes the diode to be reverse biased during operation.

20. The circuit of claim 19 wherein:
a) the transistor also has a collector and internal capacitance between the base and collector;
b) the diode has internal capacitance; and
c) the ratio of the internal capacitance in the transistor to the internal capacitance in the diode is substantially the same as the ratio of the first resistance to the second resistance.

\* \* \* \* \*